US011521965B2

(12) United States Patent
Pala

(10) Patent No.: US 11,521,965 B2
(45) Date of Patent: Dec. 6, 2022

(54) JUNCTION FIELD EFFECT TRANSISTOR WITH INTEGRATED HIGH VOLTAGE CAPACITOR

(71) Applicant: MONOLITHIC POWER SYSTEMS, INC., San Jose, CA (US)

(72) Inventor: Vipindas Pala, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 17/239,333

(22) Filed: Apr. 23, 2021

(65) Prior Publication Data

US 2022/0344326 A1 Oct. 27, 2022

(51) Int. Cl.
*H01L 27/06* (2006.01)
*H01L 29/808* (2006.01)
*H01L 49/02* (2006.01)

(52) U.S. Cl.
CPC .......... *H01L 27/0629* (2013.01); *H01L 28/60* (2013.01); *H01L 29/8083* (2013.01)

(58) Field of Classification Search
None
See application file for complete search history.

(56) References Cited

U.S. PATENT DOCUMENTS

2012/0236615 A1* 9/2012 Kitabatake .......... H01L 29/7806
363/131
2017/0040312 A1* 2/2017 Curatola ........... H01L 29/66143

* cited by examiner

*Primary Examiner* — Khaja Ahmad
(74) *Attorney, Agent, or Firm* — Beyer Law Group LLP

(57) ABSTRACT

Junction field effect transistors (JFETs) and related manufacturing methods are disclosed herein. A disclosed four terminal JFET includes an integrated high voltage capacitor (HVC). The JFET includes a first terminal coupled to a drain region, a second terminal coupled to the source region, a third terminal coupled to the base region, and an integrated HVC terminal coupled to an integrated HVC electrode which forms an HVC with the drain region. The JFET also includes a channel formed by a channel region. A bias on the base region fully depletes the channel of majority carriers. The channel has an unbiased concentration of majority carriers. The integrated HVC electrode is positioned relative to the channel region such that applying the bias to the integrated HVC terminal depletes the channel by at most ten percent of the unbiased concentration of majority carriers.

7 Claims, 6 Drawing Sheets

JUNCTION FIELD EFFECT TRANSISTOR WITH INTEGRATED HIGH VOLTAGE CAPACITOR

BACKGROUND

Junction field effect transistors (JFETs) operate by providing a conductive path between a drain and source terminal through a channel of the device in response to the application of a voltage to a third terminal. The third terminal is a channel control terminal such as a gate or base terminal. Four terminal JFETS can include both a gate terminal and a base terminal. In contrast to metal-insulator field effect transistors (MISFETs), JFETs include at least one channel control terminal which is not separated from the channel region by an insulator. Channel control terminals can be referred to as such because when an appropriate bias voltage(s) is applied to the gate and/or base, the characteristics of the channel are altered, current flows through the channel between the source and drain, and the transistor is ON. Accordingly, when an opposite bias voltage(s) is applied to the gate and/or base, the channel of the device is pinched off and the transistor is OFF. The bias voltages depend on the conductivity types (e.g., n-type or p-type) of the various regions and whether the transistor is a nominally ON or nominally OFF device.

JFETs can be used as power transistors in high power applications. High power applications include those in which the power transistors are expected to hold off voltages in the hundreds of volts range and ON currents on the order of amperes or tens of amperes. In certain high voltage applications large voltage swings can result in deleterious conditions for transistors including channel breakdown, transient voltage swings on the drain and/or source terminals overriding a signal on a channel control terminal and causing the device to switch conductivity states deleteriously, and outcoupling of unwanted noise or oscillations across the terminals of the device to other circuits. System, circuit, and device level modifications which have the potential to prevent these deleterious conditions present an important area for innovation.

SUMMARY

Methods and devices related to the field of semiconductor transistors are disclosed herein. The devices can be junction field effect transistors (JFETs). The devices can include integrated capacitors. The devices can be configured to include both the functionality of a JFET and a capacitor in a minimally sized unit cell. Although the methods and devices disclosed herein are applicable to various applications, in specific embodiments the devices can be JFETs designed for high power applications. In specific embodiments, the devices can be high power JFETs with integrated capacitors designed to enhance the stability of the systems of which they form a part. In specific embodiments, the devices can form part of a composite device and include an integrated capacitor to enhance the stability of the composite device.

In specific embodiments of the invention, a JFET is provided which includes a source region, a drain region, a base region, a channel region, and an integrated capacitor. The integrated capacitor can be provided by the inclusion of an insulated electrode provided in the same unit cell as the source, drain, base, and channel regions. The various regions of the device and the insulated electrode can all be coupled to separate terminals of the device. In specific embodiments, the disclosed JFETs are four terminal devices which have individual terminals for each of the source region, the drain region, the base region, and the integrated electrode. The terminals can be coupled to the various regions to provide ohmic contacts to those regions.

As used herein, the term "base region" refers to a region of opposite conductivity type to the channel region which, in response to the appropriate bias voltage or current, is capable of changing the state of the channel (e.g., depleting the channel). As used herein the term "contact" when used with reference to the relationship of two regions refers to the regions being physically adjacent (i.e., touching). The term is not meant to refer to an ohmic conductive electrical connection. Indeed, those of ordinary skill in the art will recognize that a base region and channel region which are in contact form a p-n junction which may or may not be conductive depending on the relative bias voltages applied to either side of the junction. If, in contrast, two regions are connected through an ohmic conductive electrical connection they will be referred to herein as being "coupled" or having an "ohmic contact." As used herein the term "active area" is used with reference to regions of semiconductor material which exhibit p-type or n-type conductivity (e.g., through their inherent characteristics or through the introduction of dopants). As used herein the term "lateral extent of the active area" of a device refers to a total surface area of the active area of a device measured as projected onto a main plane of the substrate (e.g., wafer) on which the device is located.

In specific embodiments of the invention, a JFET is provided. The JFET comprises a drain region, a drain terminal coupled to the drain region, an insulated electrode, and an insulated electrode terminal coupled to the insulated electrode. The JFET has an active area. The insulated electrode presents a capacitance to the drain terminal of between 0.1 nano-farads (nF) per centimeter squared ($cm^2$) and 10 nF per centimeter squared $cm^2$ of a lateral extent of the active area.

In specific embodiments of the invention, a four terminal JFET is provided. The JFET comprises a drain region, a source region, and a base region. The JFET also comprises a channel region having an unbiased concentration of majority carriers. The four terminals of the JFET include a first terminal coupled to the drain region, a second terminal coupled to the source region, a third terminal coupled to the base region, and an integrated high voltage capacitor terminal coupled to an integrated high voltage capacitor electrode. The integrated high voltage capacitor electrode forms a capacitor with the drain region. A bias on the base region fully depletes the channel of majority carriers, while the integrated high voltage capacitor electrode is positioned relative to the channel region such that applying the bias to the insulated high voltage capacitor terminal depletes the channel by at most ten percent of an unbiased concentration of majority carriers of the channel region. As used herein a reference to "depleting the channel" refers to depleting the channel region across a cross section which controls the state of the entire conductive path formed by the channel as being either nonconductive or conductive.

In specific embodiments of the invention, another four terminal JFET is provided. The JFET comprises a drain region, a source region, a base region, and a channel region. The JFET further comprises a first terminal coupled to the drain region, a second terminal coupled to the source region, a third terminal coupled to the base region, and an insulated electrode insulated by an insulator. The JFET further comprises a fourth terminal coupled to the insulated electrode. A portion of the channel region is in contact with the insulator and is not covered by the insulated electrode.

DETAILED DESCRIPTION

Figure 1:
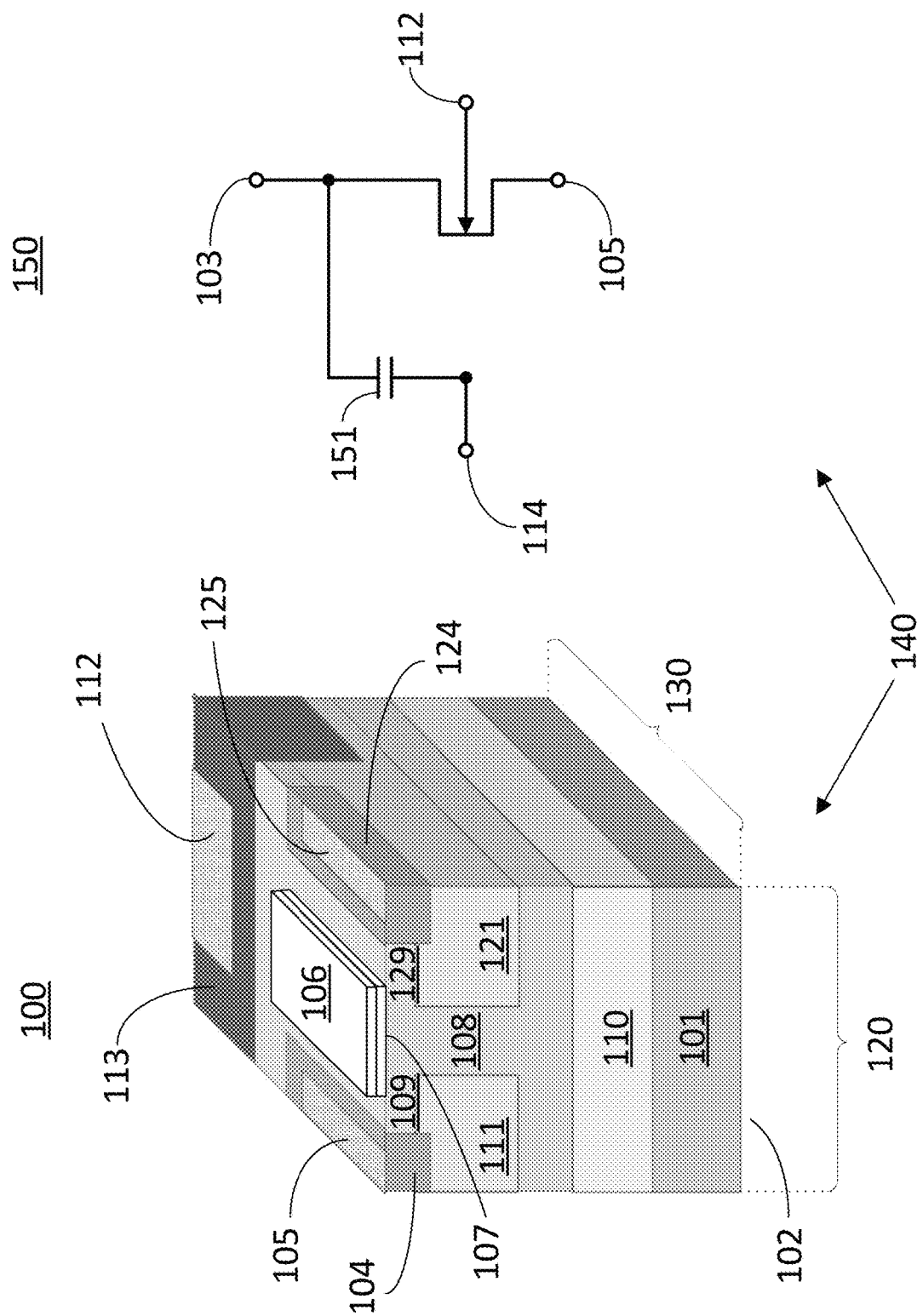
FIG. 1 illustrates an axonometric cross section and circuit schematic of a device that is in accordance with specific embodiments of the present invention.

Methods and systems related to the field of semiconductor transistors in accordance with the summary above are disclosed in detail herein. The methods and systems disclosed in this section are nonlimiting embodiments of the invention, are provided for explanatory purposes only, and should not be used to constrict the full scope of the invention.

Specific implementations of the transistors disclosed herein can be used in various applications. For example, the transistors disclosed herein can be used as power transistors. The power transistors can be used in power factor correction (PFC) circuits, all manner of power converters (e.g., AC-AC, DC-AC, etc.), motor drive circuits, and other high-power applications known to those of ordinary skill in the art. The power transistors can be used in power supply circuits for enterprise grade data center infrastructure applications, electric vehicle power supplies, high energy microwave generators such as in inverter-less microwave ovens, and other high-power applications known to those of ordinary skill in the art. Specific implementations can include power transistors that hold off voltages in the hundreds of volts range and that support ON currents on the order of amperes or tens of amperes.

Specific implementations of the transistors disclosed herein can utilize various semiconductor materials. For example, the transistors can be fabricated using various III-IV materials such as gallium nitride or silicon carbide as the base semiconductor materials. In the case of silicon carbide, the dopants can include aluminum or boron as a p-type dopant and phosphorous or nitrogen as an n-type dopant. In the case of gallium nitride, the dopants can include magnesium as a p-type dopant and silicon or oxygen as an n-type dopant. The various regions of material disclosed herein can therefore be formed in various semiconductor materials such as silicon carbide and be activated through the introduction of a compatible dopant species for the selected semiconductor material to form active regions such as channel, channel control, drain, and source regions.

In specific high voltage applications capacitors can be used to prevent ringing or other instabilities caused by large voltage and current swings. In the case of transistors used in high voltage applications, capacitors can be used to shield terminals of a transistor from volage and current swings on alternative terminals, to increase the slew rate of the transistor to prevent ringing or other instabilities caused by the transistor channel changing states too rapidly, and to generally increase the phase and voltage margin of any feedback loops formed between the various nodes and terminals of the circuit. However, although stability is an important aspect of transistor device performance, space is also an important aspect because, among other reason, the cost of the device increases with the surface area of the substrate (e.g., wafer) consumed by the device. Additionally, for a capacitor to conduct some of the actions described above it needs to be in close physical proximity to the terminals it is shielding. High power transistors can therefore benefit from the inclusion of integrated high voltage capacitors. More specifically, high power transistors that consist of a collection of unit cells can benefit from the inclusion of high voltage capacitors integrated into the unit cells of the device.

In specific embodiments of the invention disclosed herein, a JFET with an integrated capacitor is disclosed. In specific embodiments the JFET is a power JFET and the integrated capacitor is a high voltage capacitor. The integrated capacitor can include an insulated electrode within the lateral area of the JFET. The insulated electrode can present a capacitance to the drain terminal of the JFET. In other words, the drain terminal and insulated electrode can be portions of two electrodes that define a capacitor with the aforementioned capacitance. In high power applications in which the JFET is serving as a power transistor for holding off large voltages and switching to passing tens of amps, the insulated electrode can present a capacitance to the drain terminal of the device of between 0.1 nF per $cm^2$ of a lateral extent of the active area of the JFET to 10 nF per $cm^2$ of a lateral extent of the active area. Although many transistors that operate in this range will include parasitic capacitance between their terminals, a standard power transistor without a dedicated integrated capacitor will generally exhibit parasitic capacitances on the order of tens of femto-farads to pico-farads (pF) per $cm^2$ of the lateral extent of their active area. Normalizing the capacitance with respect to the size of the unit cell is relevant because it is both a proxy for the current the unit cell can sink and for the amount of capacitance formed between terminals on the device relative to the insulated electrode.

Specific benefits of the inventions disclosed herein can accrue to various types of transistors. As stated, the transistors can be JFETs. The JFETs can be unit cell JFETs or multicell JFETs. The transistors can be lateral devices, vertical devices, planar devices, fin device, and/or trench devices. The transistors can also be BJTs, IGBTs, MISFETs, HEMTs, and many other device types. Accordingly, although many of the remaining examples in this disclosure are directed to JFETs, the invention is not limited to such devices.

FIG. 1 illustrates an axonometric cross section 100 of a device in the form of a vertical planar JFET 140 and an accompanying device schematic 150 of JFET 140 that are in accordance with specific embodiments of the invention disclosed herein. JFET 140 is on a substrate 101 and has been either formed on substrate 101 through the introduction of dopants to substrate 101, through the or growth or deposition of layers on substrate 101 or formed separately from substrate 101 and then attached to substrate 101.

JFET 140 is a four-terminal device. JFET 140 includes a drain region 102 and a drain terminal 103 coupled to the drain region. In the cross section, the drain region 102 is also the substrate 101 of the device and the drain terminal 103, while not shown in the cross section, could be a contact formed to the bottom of the substrate 101. JFET 140 also includes an insulated electrode terminal 114 coupled to an insulated electrode 106. Again, while not shown in the cross section, the insulated electrode terminal 114 would be a contact formed to insulated electrode 106. The insulated electrode 106 can be sheathed in an insulator 107. Insulator 107 could overlay additional portions of JFET 140 and is shown only in the proximity of insulated electrode 106 to leave the remainder of JFET 140 visible. JFET 140 also includes a source region 104, 124 and a source terminal 105, 125. JFET 140 also includes a vertical channel region 108 formed on an epitaxial layer 110 and a lateral channel region 109, 129. The channel regions can be depleted by the application of a bias voltage to base region 111, 113, 121 via base terminal 112. The material of base region 111, 113, 121 is shown as having a heavily doped darker region (base region 113) connected to a more lightly doped lighter region (base region 111, 121). The lighter region is the portion that directly impacts the channel of the device. The base terminal 112 can be the only control terminal of the JFET 140.

In a specific embodiment of the invention, the disclosed transistors are nominally ON transistors meaning that the transistor is in a conductive state when the control electrode is unbiased. JFET 140 is an example of a nominally ON transistor. Source region 104, 124 channel region 108, 109, 129, epitaxial layer 110, and substrate 101 have a first conductivity type, and base region 111, 121 has a second conductivity type. Therefore, when no bias is applied to base region 111, 121, there is a conductive path from source region 104, 124 down vertically through the device to drain region 102, and JFET 140 is in a ON or conductive state. However, when a bias is applied to base region 111, 121 via base terminal 112, the channel (can be depleted of majority carriers (e.g., at the lateral channel region 109, 129 in the illustrated case) and the JFET will change to a non-conductive state. In a specific embodiment, the lightly shaded portion of base region 111, 121 can be a heavily doped p-type (P+) region, source region 104, 124 can be a heavily doped n-type region (N+) region, the darker shaded portion of base region 111 can be an even more heavily doped p-type region (P++), and vertical channel region 108, lateral channel region 109, 129, epitaxial layer 110, and substrate 101 can be lightly doped n-type (N) regions. In an alternative embodiment, the polarity of these regions could be switched to form a device having an opposite conductivity type.

JFET 140 is configured such that the insulated electrode 106 presents a capacitance, represented by capacitor 151 in device schematic 150, to the drain terminal 103 on the order of between 0.1 nF per cm$^2$ of a lateral extent of the active area of JFET 140 to 10 nF per cm$^2$ of the lateral extent of the active area of JFET 140. In the illustrated case, JFET 140 is a unit cell of a larger multiunit JFET. JFET 140 could form part of a continuous pattern by being replicated to the left and right and rotated 180 degrees around an axis formed by a line drawn vertically on the plane of the page and replicated to the front and back. The borders of the illustrated cross section therefore form the full lateral extent of a unit cell for JFET 140. As the unit cell is a standard rectangle and as the active area of the channel region and base region 111, 121, 113 extends throughout the entire lateral extent of the unit cell, the lateral extent of the active area in JFET 140 is equivalent to the area defined by the length of dimension 120 multiplied by the length of dimension 130. The same concept would apply to a standalone transistor as opposed to a unit cell with the active area of the standalone transistor defining the active area of the device.

In specific embodiments of the invention, the insulated electrode that presents a capacitance to the drain terminal of the device is not a gate of the device. In the context of a JFET, the insulated electrode is accordingly configured and positioned so that it is not capable of contributing to the depletion of the channel. As will be seen in some of the embodiments discussed below the fact that the insulated electrode does not need to have an impact on the channel can provide significant benefits such as a reduced unit cell size, greater flexibility in terms of shielding positioning, greater flexibility in the voltages that can be applied to the insulated electrode terminal while the device is operational, and thicker insulators layers to make the capacitor more robust. In specific embodiments, the insulated electrode is positioned such that it does not deplete the channel by more than ten percent of an unbiased concentration of majority carriers of the channel when a bias is applied to the insulated electrode that would have fully depleted the channel if it had been applied to the base region of the JFET. In specific embodiments, the insulated electrode is positioned such that it cannot change the state of the JFET to a conductive state when that bias voltage is applied.

Insulated electrode 106 in FIG. 1 is not a gate electrode for JFET 140. Lateral channel region 109, 129 of JFET 140 has an unbiased concentration of majority carriers defined by the doping concentration in that region and a bias applied to base region 111, 121 fully depletes the lateral channel region 109, 129 channel region of majority carriers. However, the insulated electrode 106 is positioned relative to the lateral channel region 109, 129 such that applying that same bias to the insulated electrode terminal 114 depletes the lateral channel region 109, 129 by at most ten percent from an unbiased state. As the insulated electrode 106 is not a gate of the device, JFET 140 is a four terminal JFET but only include a single channel control terminal. The fourth terminal, in the form of the insulated electrode terminal 114, is solely provided to bias the capacitor presented to the drain terminal 103 of JFET 140.

In specific embodiments of the invention, a JFET can include an insulated electrode terminal in the form of an integrated high voltage capacitor terminal. In specific embodiments of the invention, the integrated high voltage capacitor terminal is not a channel control terminal for the device. Although bias voltages applied to the terminal could impact the conductivity state of the channel in some embodiments, in other embodiments bias voltages applied to the terminal have a de minimus impact on the conductivity state. The integrated high voltage capacitor terminal could be coupled to an insulated electrode in the form of a region of metal or heavily doped polysilicon within the lateral extent of the device. The insulator sheathing the integrated electrode could be a thicker than the gate insulator of standard transistors and could have a thickness greater than 1000 Angstroms (A). The increased thickness, while deleterious for the efficacy of a standard gate electrode, would make the capacitor hardier in terms of its ability to withstand large voltages without experiencing breakdown. In specific embodiments, the insulator of the insulated electrode could be in contact with the channel region of the device and separate the channel region from the insulated electrode by greater than 1000 A.

Returning to the example of FIG. 1, insulator 107 can be thicker than gate insulators for standard power transistors. For example, insulator 107 could be greater than 1000 A. This thickness would usually limit the ability of a bias applied to insulated electrode 106 to impact channel region 109, 129, 108. However, it does allow the insulator 107 to withstand higher voltages applied to drain region 102 as compared to insulated electrode 106 (e.g., across capacitor 151) which is beneficial for high power applications as the voltage on drain terminal 103 can range into the hundreds of volts.

In specific embodiments of the invention the devices disclosed herein can be used in systems such as composite devices. The composite devices could include a high-voltage transistor and a low voltage transistor. The composite devices could include a nominally ON device and a nominally OFF device. The composite devices could include a JFET, such as one having one or more of the characteristics described above, connected to a second transistor. For example, the JFETs could be high-voltage nominally ON devices connected in series with nominally OFF lower power devices to form composite high-voltage switches. The nominally OFF lower power devices could be enhancement mode FETs. The nominally OFF devices could be silicon devices formed on a separate substrate as the nominally ON device. The nominally ON and nominally OFF devices could be connected in series and operate as a single switch. Although this type of system is used as an example in the remainder of this disclosure, the devices disclosed herein are more broadly applicable to various kinds of systems.

Figure 2:
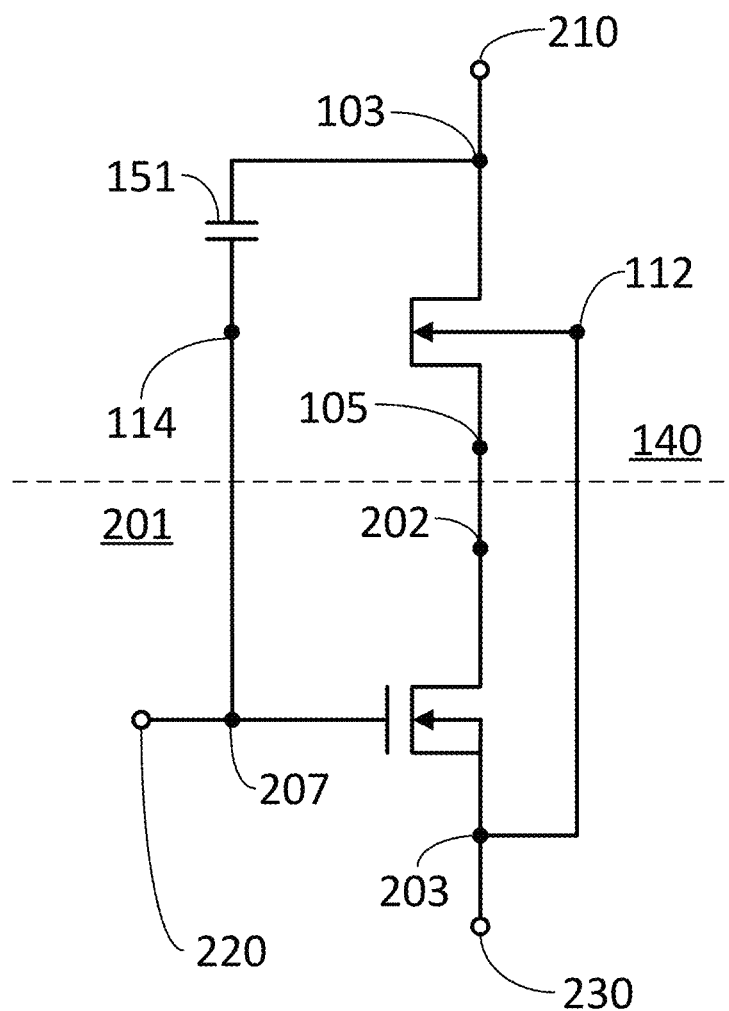
FIG. 2 illustrates a circuit schematic of a composite device with an integrated capacitor that is in accordance with specific embodiments of the present invention.

FIG. 2 provides an example circuit schematic of a composite device 200. The composite device 200 includes JFET 140 from FIG. 1 connected to FET 201. JFET 140 is, as mentioned above, a high power nominally ON device. FET 201 is a nominally OFF enhancement mode FET. In the composite device, the state of FET 201 sets the state of the composite device. The two devices are coupled together to produce a high-voltage switch with specific characteristics that depend not only on the topology of the schematic but also the physical layout of the device. Regarding the internal topology of the circuit, source terminal 105 of JFET 140 is connected to a drain terminal 202 of FET 201, a base terminal 112 of JFET 140 is connected to a source terminal 203 of FET 201, and an insulated electrode terminal 114 of JFET 140 is connected to a channel control terminal 207 of FET 201.

Composite device 200 is a three terminal device comprising a drain terminal 210, a gate terminal 220, and a source terminal 230. The gate terminal 220 is coupled to the channel control terminal 207 of FET 201. The drain terminal 210 is connected to drain terminal 103 of JFET 140. The source terminal 230 is connected to source terminal 203 of FET 201 and to base terminal 112 of JFET 140. The composite device 200 forms a conductive path between drain terminal 210 and composite device source terminal 230 in response to the application of an appropriate bias signal to gate terminal 220. Composite device 200 can be used in a high voltage switching application in which the switch alternates its state based on the bias voltage applied to gate terminal 220. For example, when the bias voltage on gate terminal 220 is low there may be no conductive pathway between drain terminal 210 and source terminal 230 and when the bias voltage on gate terminal 220 is high there may be a low resistance conductive pathway between drain terminal 210 and source terminal 230. The capacitor 151 provides significant benefits in this situation because it can control the slew rate of the composite device and therefore increase the stability of the circuit. In specific embodiments of the invention, in which the device can tolerate currents on the order of 01-100 Amperes this capacitor can have a capacitance on the order of 1 pF –10 nF.

Figure 3:
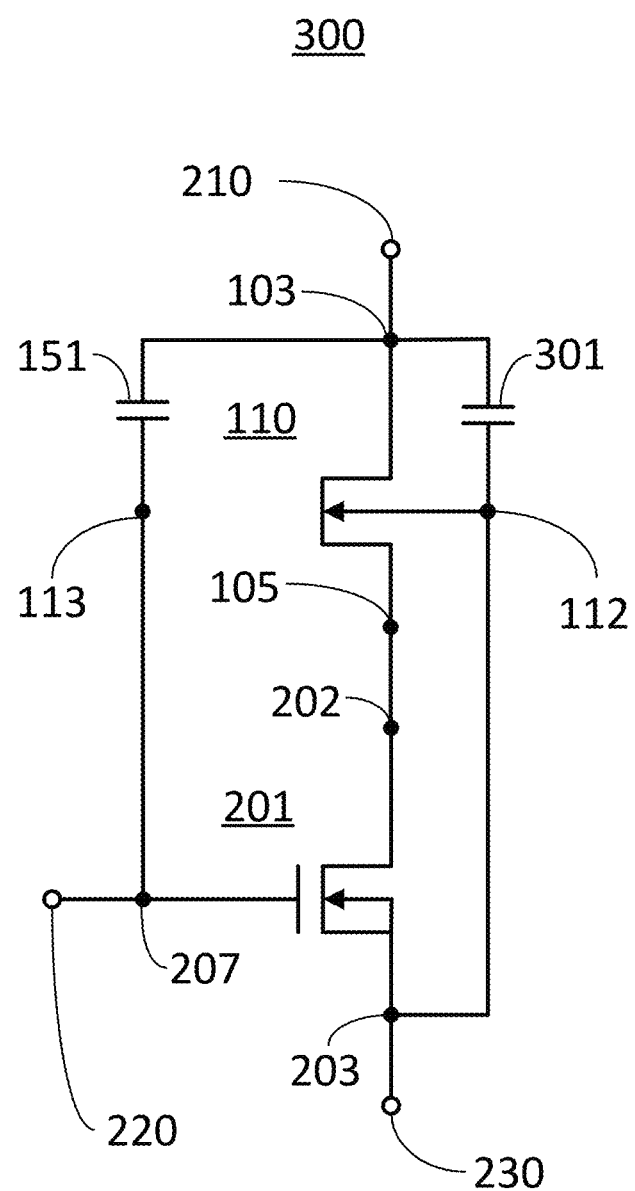
FIG. 3 illustrates a circuit schematic of a composite device with a shielding capacitor that is in accordance with specific embodiments of the present invention.

In specific embodiments of the invention, the devices disclosed herein can include shielding for the integrated high voltage capacitor. The shielding can be achieved by introducing another capacitance to the device which shares one common node with the integrated high voltage capacitor. For example, shielding for an integrated capacitor such as capacitor 151 can be provided by presenting a relatively larger surface area of the base region of JFET 140 to the drain terminal 103 of the device as compared to the surface area of the insulated electrode coupled to insulated electrode terminal 114. The base region could at least partially shield the insulated electrode from the drain terminal of the device. This type of approach can be beneficial in certain applications. For example, in the types of circuits illustrated by FIG. 2 the insulated electrode is coupled to the channel control terminal of FET 201. As such, noise coupled through the capacitor 151 could potentially cause the FET 201 to turn on or off when it should not, leading to an unstable system. As such, the devices with integrated high voltage capacitors disclosed herein can also be configured to present a shielding capacitor to the drain terminal of the composite device such as shielding capacitor 301 shown in composite device 300 in FIG. 3. Composite device 300 can exhibit all the characteristics of composite device 200 described above with the addition of this shielding capacitor 301. The shielding capacitor 301 can be conceptualized as such in that changes in potential on drain terminal 210 caused by the movement of charge carriers, that would have otherwise caused a discharging or charging of capacitor 151 and had a commensurate impact on the potential of channel control terminal 207, will have less of an impact on channel control terminal 207 due to the fact that the change in charge carriers will now have to contend with the presence of shielding capacitor 301. The degree of shielding therefore increases with the capacitance of shielding capacitor 301 relative to capacitor 151.

Figure 4:
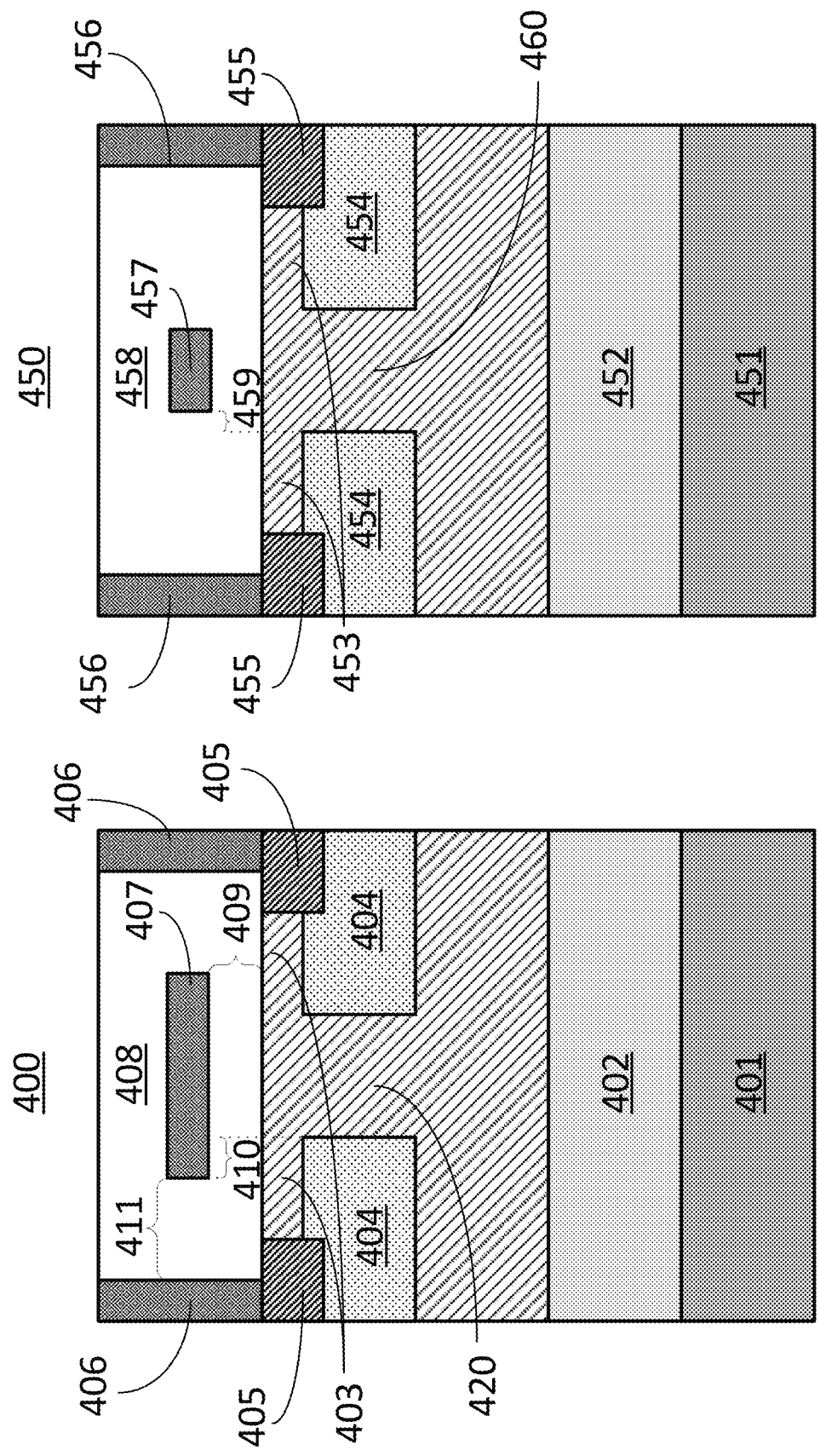
FIG. 4 illustrates cross sections of devices with variant insulated electrode widths that are in accordance with specific embodiments of the present invention.

FIG. 4 includes two cross sections 400 and 450 to illustrate specific benefits that accrue to certain embodiments of the invention disclosed herein. As mentioned above, the fact that some of the devices disclosed herein include insulated electrodes which are not used to control the channel increases the flexibility afforded to the design as will be described with reference to cross sections 400 and 450. Both illustrated cross sections are of JFET devices formed on a substrate 401, 451. The devices also include an epitaxial region 402, 452. The device also includes a lateral channel region 403, 453 which extends along the top of base region 404 and 454, and a vertical channel region 420, 460 which is formed by a gap in the base region 404, 454. The device also includes a spreading region which extends under base region 404, 454. The devices also include a source region 405, 455 and source terminals 406 and 456. Base region 404, 454 is biased out of the plane of the page in a similar fashion to base region 111 in FIG. 1.

In specific embodiments of the invention the integrated capacitor can be more robust that the capacitor formed by a standard gate electrode. Cross section 400 includes an insulated electrode 407 which forms a capacitor with the drain of the device. The insulator 408 that sheathes insulated electrode 407 and is in contact with the top of lateral channel region 403 is the dielectric of that capacitor. The insulated electrode 407 is biased through the application of a voltage to an insulated electrode terminal outside the plane of the page. The insulator can be various materials such as silicon nitride, silicon di-oxide, silicon oxy-nitride, aluminum oxide, aluminum nitride, or other dielectrics. As the insulated electrode 407 does not need to serve as a gate of the device the device of cross section 400 exhibits several beneficial characteristics. For example, the thickness 409 of this insulator can be greater than 1000 A. In specific embodiments such as the embodiments illustrated by cross section 400, the insulator can be anywhere from 1200 A to 2500 A. This is beneficial because the voltage on the drain terminal (e.g., substrate 401) can be hundreds of volts and increasing the thickness of the insulator makes the capacitor less likely to breakdown.

In specific embodiments of the invention the integrated capacitor does not need to extend over an entire lateral channel region of the device into which it is integrated. For example, insulated electrode 407 does not need to overlay the entire channel region of the device (i.e., it does not need to extend all the way to the contact between the source region and the lateral channel region). A portion of the lateral channel region 403 is in contact with the insulator 408 and is not covered by the insulated electrode 407. As shown in FIG. 4, insulated electrode 407 extends over the lateral channel by a distance 410 but does not extend over a portion of the lateral channel. In a similar way, devices in accordance with this disclosure can include insulated electrodes where at least a portion of channel region is not covered by the channel. This is beneficial because the distance between source terminal 406 and insulated electrode 407, marked distance 411 in the figure, is a limiting feature size for minimization of the unit cell. In other words, since insulated electrode 407 does not need to extend in a lateral direction all the way to source region 405, the unit cell can be made narrower and therefore significant space savings can be realized. In cross section 450, the insulated electrode 457, as sheathed in insulator 458, is even more narrow than in cross section 400. As a result, the unit cell pitch of a device based on cross section 450 can be even smaller while still providing a capacitance to the drain of the device. As seen in cross section 450, insulated electrode 457 does not even extend over the width of the vertical channel region 460. The distance 459 shows that this difference. Regardless, both cross sections illustrate how the cell pitch of a unit cell using the disclosed integrated electrode of these embodiments is not affected by the minimum required source-to-gate spacing of a four-terminal device in which the insulated electrode 407, 457 was a gate of the device.

In specific embodiments of the invention, the insulated electrode can provide shielding to a source terminal of the device. In these embodiments, the insulated electrode can be conceptualized as a shield plate of the transistor. The shielding can be in addition to shielding provided by a base region of the device with both the insulated electrode and the base region shielding the source terminal while the base region also shields the insulated electrode itself. The devices could include a base region with a gap in the base region for a vertical channel. In these devices, the current of the device could flow between the drain region and the source region vertically through the gap. The base region could be located between the source and the drain. In these embodiments, the insulated electrode could be located over the gap, and could cover the gap. However, a lateral extent of the insulated electrode could still be smaller than a lateral extent of the channel region. In either situation the insulated electrode can serve to shield the source terminal while total coverage of the gap is likely to provide a higher degree of shielding. FIG. 4 provides an example of both such approaches as insulated electrode 407 covers the gap in base region 404 and insulated electrode 457 is located over the gap in base region 454 but does not cover the gap. In cross section 400, a lateral extent of insulated electrode 407 does not extend to the source region 405. While in both cases the pitch of the unit cell can be minimized, and the structure of cross section 450 is even more beneficial in terms of unit cell pitch, the lack of an overlap marked by distance 459 is deleterious in certain applications because less shielding is provided between source terminal 456 and the drain (i.e., substrate 451, as compared to the case of cross section 400 in which the electrode extends beyond the vertical channel on both sides by distance 410).

The cross sections of FIG. 4 also illustrated how a device can provide a shielding capacitor such as shielding capacitor 301 to a composite device such as composite device 300. As stated in the previous paragraph, insulated electrodes 407 and 457 serves to shield portions of the device from voltages applied to the drain of the device. Both devices can be conceptualized as shield plates for source terminals 406 and 456. In particular, insulated electrode 407 provides a high degree of shielding as it extends over base region 404. This is because base regions 404 and 454 present a capacitance to the drain terminal of the device. When the devices of FIG. 4 are used as JFET 140 in FIG. 3, the capacitance provided by the base region can be part of shielding capacitor 301 in FIG. 3.

Figure 5:
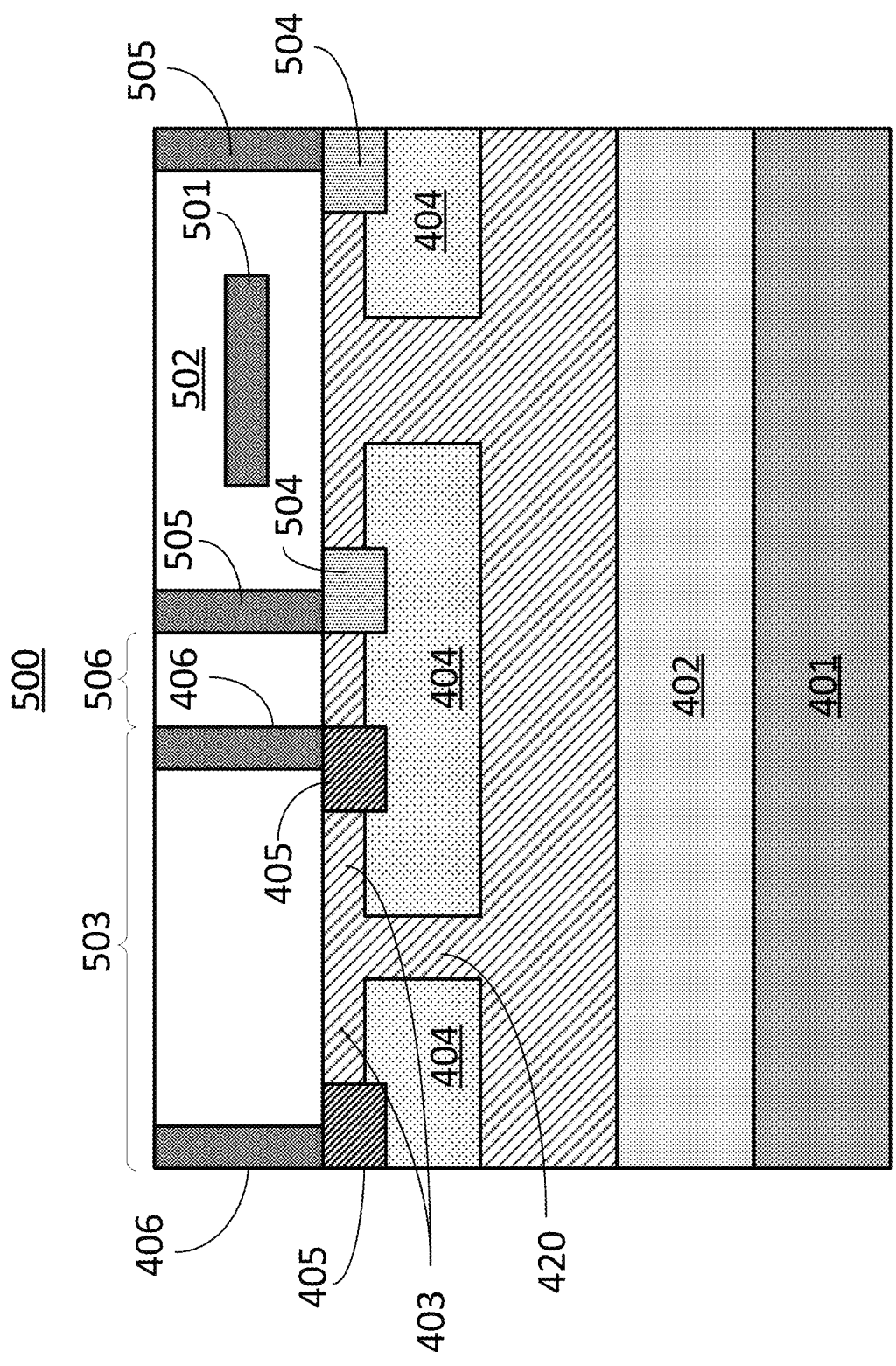
FIG. 5 illustrates a cross section of a device with a flexibly situated integrated capacitor in accordance with specific embodiments of the present invention.

In specific embodiments of the invention, the integrated capacitor can be located such that it is spaced apart from the channel of the device. The integrated capacitor could be located such that it is located on the same die but not necessarily in the same unit cell as the transistor device. The integrated capacitor could also be located in the same unit cell as the transistor but in a portion that is far removed from the channel of the device. The integrated electrode could be located outside of an area set by the source region of the device either along the direction of the lateral dimension of the channel or perpendicular to that dimension. For example, the insulated electrode could be in the region of the device occupied by the base region contact in FIG. 1, or it could be located to the side of the main portion of the device as shown in FIG. 5. In cross section 500, the insulated electrode 501 is sheathed in an insulator 502 and is located on the same die as device 503 but is not proximate the channel of device 503. Device 503, and cross section 500 generally, include many of the elements of cross section 400 and like elements are labeled with the same reference numbers. Current flow through device 503 is from substrate 401 through vertical channel region 420, lateral channel region 403, source region 405, and source terminal 406. As with cross section 400, the conductivity type of source region 405, lateral channel region 403, epitaxial region 402, and substrate 401 may all be the same, with base region 404 having an opposite conductivity type. Furthermore, base contact regions 504 could have the same conductivity as base region 404 and be used to bias the base of device 503 via base contacts 505. Device 503 could be considerably smaller as there would be no spacing requirement for an electrode between the two parts of source terminal 406. Furthermore, in specific embodiments, insulated electrode 501 could be shared by an adjacent device similar to device 503 formed on the right side of the cross section with the device flipped to include gap 506.

Although specific embodiments of the invention have been described with respect to a vertical planar device, the inventions disclosed herein are more broadly applicable to multiple transistor types include mesa devices. The mesa devices could be JFETs. The mesa devices could be high power FETs. In specific embodiments of the invention, a source region is formed in a mesa of the JFET and an insulated electrode is located next to the mesa on a first side of the mesa. The channel region of the JFET could be located closer to the second side of the mesa than the first side of the mesa. In specific embodiments of the invention, the JFET could include an insulator for the insulated terminal where the insulator is in contact with the first side of the mesa. The insulator could be formed on the side of the mesa and serve as the dielectric for an integrated high voltage capacitor wherein the insulated electrode was a high voltage capacitor electrode of that capacitor.

Figure 6:
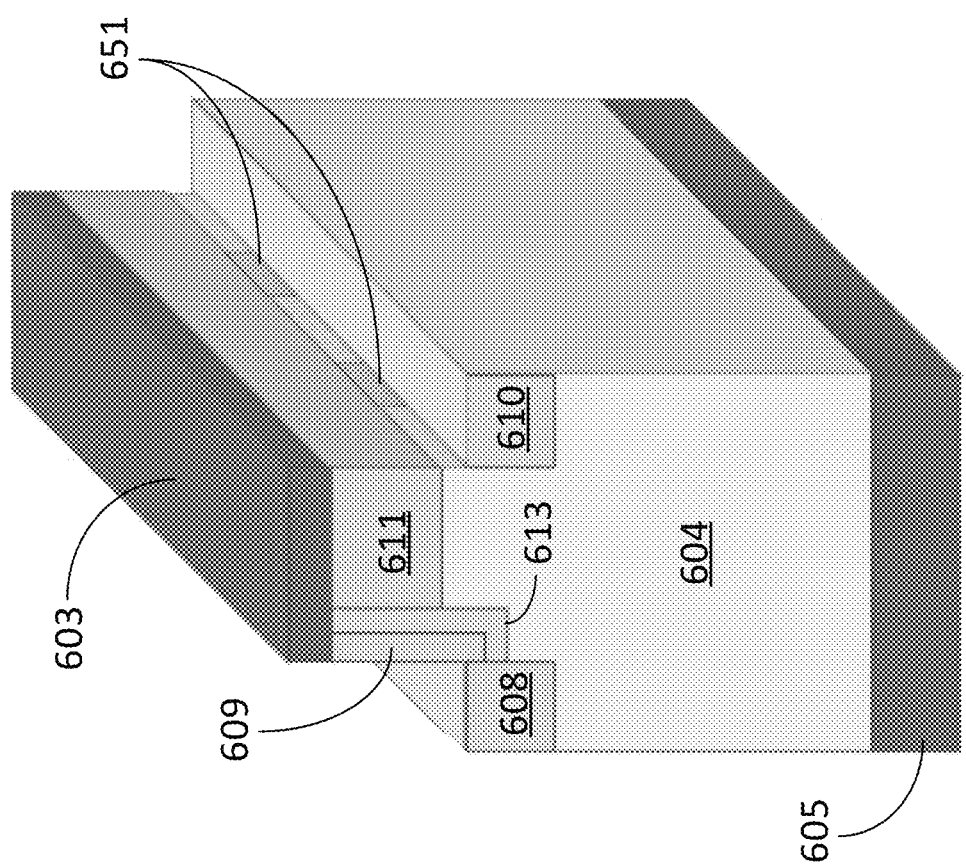
FIG. 6 illustrates a cross section and axonometric cross section of a mesa device that is in accordance with specific embodiments of the present invention.
Figure 6:
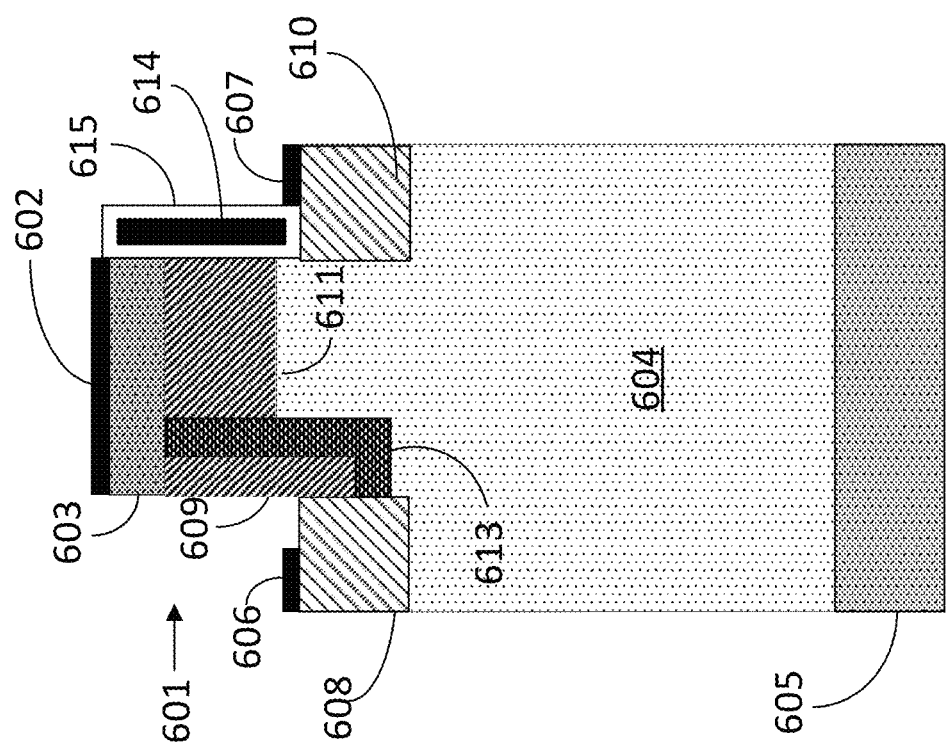

FIG. 6 illustrates a cross section 600 and axonometric cross section 650 of a vertical JFET with an integrated capacitor. The contacts and capacitor have been removed in the axonometric cross section 650 to expose an additional detail of the device. The illustrated JFET is a mesa vertical JFET. Mesa vertical JFET devices are referred to as such because the vertical channels of both devices are formed in mesas of active material (e.g., mesa 601). Mesa vertical JFET devices are also, in some cases, referred to as trench vertical JFETs. Current ultimately flows from a source terminal 602 and a source region 603 through a vertical channel region 613, a drift region 604, and a drain region 605. As above, the drain region 605 can be the substrate on which the device is built and the drift region 604 can be an epitaxially layer grown on the substrate. Current flow is controlled through the application of a bias voltage to two sets of base contacts 606 and 607 and two sets of base regions 608/609 and 610/611. In cross section 600, there is no connection between base region 610 and 611. However, as can be seen in axonometric cross section 650, there are break points 651 at which base regions 610/611 are connected. The application of an appropriate bias voltage can serve to allow current to flow through a vertical channel region 613 of the device or to pinch off the channel by depleting it of carriers. As stated above, depending upon the conductivity type of the channel of the devices, this bias voltage can be positive or negative with respect to the alternative regions of the device.

In specific embodiments of the invention, source region 603 can be a heavily doped n-type region, drift region 604 and vertical channel region 613 can be lighter doped n-type regions, base regions 608/610 can be heavily doped p-type regions and base regions 609/611 can be more lightly doped p-type regions. In specific embodiments of the invention, the polarity of these regions can all be flipped.

FIG. 6 also includes an insulated electrode 614 surrounded by an insulator 615. The insulated electrode 614 can form a capacitor with a drain region 605 of the device. Insulated electrode 614 is positioned such that it cannot deplete the channel formed by channel region 613 by more than ten percent of an unbiased concentration of majority carriers of the channel. The capacitor can have a capacitance on the order of that described with reference to FIG. 1 above with the illustrated cross section 600 representing a cross section of a unit cell of the transistor. The insulator 615 is formed on a side of mesa 601. In specific embodiments of the invention, the insulator 615 can be any of the insulator materials mentioned above such as silicon dioxide, silicon nitride, and other insulating materials. In specific embodiments of the invention, the insulated electrode 614 can be heavily doped polysilicon or a metal. The capacitor formed between drain region 605 and insulated electrode 614 can serve the same purpose as capacitor 151 as formed if the device in cross section 600 is used in place of JFET 140 in composite device 200.

Specific implementations of the JFETs disclosed herein can take on various forms and should not be constrained by the illustrated cross sections which are provided for purposes of illustration only. For example, FIG. 6 provides a cross section 600 of a single mesa, but the illustrated mesa may be a single cell in a multi-mesa device where each mesa shares electrically connected channel control, drain, and/or source regions. Furthermore, although FIG. 6 illustrates source region 603 located on a top side of mesa 601 and a drain region 605 located below mesa 601 where the vertical channel region 613 provides a conductive path between the drain layer and source layer when the junction FET is ON, in specific embodiments the location of these terminals can be switched. Furthermore, although FIG. 6 includes a drift region 604 isolating the vertical channel region 613 from drain region 605 and having the same conductivity type but less dopant concentration than drain region 605, devices in accordance with this disclosure do not necessarily require a drift region. Furthermore, the term "mesa" should not be constrained, as in FIG. 6, to a structure having trenches on either side as a mesa can be defined by a single trench on one side and some form of isolation structure on an alternative side (i.e., two trenches do not need to be formed to form a mesa).

While the specification has been described in detail with respect to specific embodiments of the invention, it will be appreciated that those skilled in the art, upon attaining an understanding of the foregoing, may readily conceive of alterations to, variations of, and equivalents to these embodiments. For example, although the example of a power transistor was used throughout this disclosure, specific embodiments disclosed herein are more broadly applicable to any JFET. Furthermore, although III-V materials were provided by way of example, specific embodiments disclosed herein are broadly applicable to any form of semiconductor technology. Furthermore, although most examples were provided with reference to a drift or epitaxial layer in the illustrated device, these layers are optional and the portions of the devices that are in contact with the epitaxially or drift regions could instead by in contact with the substrate of the device. These and other modifications and variations to the present invention may be practiced by those skilled in the art, without departing from the scope of the present invention, which is more particularly set forth in the appended claims.

What is claimed is:

1. A junction field effect transistor (FET) comprising:
a drain region;
a drain terminal coupled to the drain region;
an insulated electrode; and
an insulated electrode terminal coupled to the insulated electrode;
wherein the junction FET has an active area; and
wherein the insulated electrode presents a capacitance to the drain terminal of between 0.1 nano-farads per centimeter squared of the active area to 10 nano-farads per centimeter squared of a lateral extent of the active area.

2. The junction FET of claim 1, further comprising:
a channel region forming a channel having an unbiased concentration of majority carriers; and
a base region;
wherein a bias on the base region fully depletes the channel region of majority carriers; and
wherein the insulated electrode is positioned relative to the channel region such that applying the bias to the insulated electrode terminal depletes the channel by at most ten percent of the unbiased concentration of majority carriers.

3. The junction FET of claim 1, wherein:
the insulated electrode terminal is an integrated high voltage capacitor terminal; and
the insulated electrode terminal is not a channel control terminal.

4. The junction FET of claim 1, further comprising:
a channel region;
an insulator of the insulated electrode;
wherein the insulator is in contact with the channel region; and
wherein the insulator separates the channel region from the insulated electrode by greater than 1000 angstroms.

5. A four terminal junction field effect transistor (FET) comprising:
a drain region, a source region, and a base region;
a channel formed by a channel region;
a first terminal coupled to the drain region;
a second terminal coupled to the source region;
a third terminal coupled to the base region; and
an integrated high voltage capacitor terminal coupled to an integrated high voltage capacitor electrode;
wherein the integrated high voltage capacitor electrode forms a capacitor with the drain region;
wherein a bias on the base region fully depletes the channel of majority carriers;
wherein the channel has an unbiased concentration of majority carriers; and
wherein the integrated high voltage capacitor electrode is positioned relative to the channel region such that applying the bias to the integrated high voltage capacitor terminal depletes the channel by at most ten percent of the unbiased concentration of majority carriers.

6. The four terminal junction FET of claim 5, further comprising:
an insulator that sheathes the integrated high voltage capacitor electrode;
wherein the insulator is in contact with the channel region; and
wherein the insulator separates the channel region from the integrated high voltage capacitor electrode by greater than 1000 angstroms.

7. A four terminal junction field effect transistor (FET) comprising:
a drain region, a source region, a base region, and a channel region;
a first terminal coupled to the drain region;
a second terminal coupled to the source region;
a third terminal coupled to the base region;
an insulated electrode insulated by an insulator;
a fourth terminal coupled to the insulated electrode;
wherein a portion of the channel region is: (i) in contact with the insulator; and (ii) not covered by the insulated electrode;
wherein the four terminal junction FET has an active area lateral extent defined by a combined extent of the source region, the drain region, and the base region measured from a top down perspective of the four terminal junction FET; and
wherein the insulated electrode presents from 0.1 nano-farads per centimeter squared of the active area lateral extent to 10 nano-farads per centimeter squared of the active area lateral extent of capacitance to the first terminal.

* * * * *